US008835023B1

(12) United States Patent
Ihlefeld

(10) Patent No.: US 8,835,023 B1
(45) Date of Patent: Sep. 16, 2014

(54) ZNO BUFFER LAYER FOR METAL FILMS ON SILICON SUBSTRATES

(75) Inventor: Jon Ihlefeld, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 142 days.

(21) Appl. No.: 13/584,641

(22) Filed: Aug. 13, 2012

Related U.S. Application Data

(60) Provisional application No. 61/526,103, filed on Aug. 22, 2011.

(51) Int. Cl.
| | |
|---|---|
| *B05D 5/12* | (2006.01) |
| *B05D 3/02* | (2006.01) |
| *B05D 1/36* | (2006.01) |
| *B32B 9/04* | (2006.01) |
| *B32B 13/04* | (2006.01) |
| *B32B 9/00* | (2006.01) |
| *B32B 19/00* | (2006.01) |

(52) U.S. Cl.
USPC ..... 428/701; 427/100; 427/126.3; 427/383.1; 427/419.3; 428/446; 428/448; 428/697; 428/699; 428/702

(58) Field of Classification Search
CPC ........ B32B 15/018; B32B 15/20; B32B 7/00; C01B 33/02; C04B 41/5049; C04B 41/5105; C04B 41/5111; C04B 41/5116; C04B 41/5122; C04B 41/5127; C04B 41/5194; C01P 2002/34; H01L 41/00; H01L 41/047; H01L 41/0815; H01L 41/083; H01L 41/1876; H01L 41/1871
USPC ................. 428/446, 448, 697, 699, 701, 702; 427/100, 126.3, 383.1, 419.3
See application file for complete search history.

(56) References Cited

U.S. PATENT DOCUMENTS

| | | | | |
|---|---|---|---|---|
| 6,666,943 | B2 * | 12/2003 | Wada et al. | 156/230 |
| 6,732,415 | B2 * | 5/2004 | Nakatani et al. | 29/25.35 |
| 2009/0066763 | A1 * | 3/2009 | Fujii et al. | 347/68 |

OTHER PUBLICATIONS

Elliot et al., "A wideband SAW convolver utilizing Sezawa waves in the metal-ZnO-SiO2-Si configuration", Appl. Physics Letters, vol. 32, No. 9, 1978, pp. 515-516.*

(Continued)

*Primary Examiner* — Jonathan Langman
(74) *Attorney, Agent, or Firm* — Kevin W. Bieg

(57) ABSTRACT

Dramatic improvements in metallization integrity and electroceramic thin film performance can be achieved by the use of the ZnO buffer layer to minimize interfacial energy between metallization and adhesion layers. In particular, the invention provides a substrate metallization method utilizing a ZnO adhesion layer that has a high work of adhesion, which in turn enables processing under thermal budgets typically reserved for more exotic ceramic, single-crystal, or metal foil substrates. Embodiments of the present invention can be used in a broad range of applications beyond ferroelectric capacitors, including microelectromechanical systems, microprinted heaters and sensors, and electrochemical energy storage, where integrity of metallized silicon to high temperatures is necessary.

22 Claims, 12 Drawing Sheets

(56) References Cited

OTHER PUBLICATIONS

Caliendo et al., "Surface Acoustic Wave H2 Sensor on Silicon Substrate", Ultrasonics Symposium 1998 Proceedings IEEE, vol. 1, 1998, pp. 569-574, abstract only.*

H.N. Al-Shareef, et al., Metallization Schemes for Dielectric Thin Film Capacitors, J. Mater. Res., vol. 12, No. 2, Feb. 1997, pp. 347-354.

S.M. Aygun, et al., Permittivity Scaling in Ba1-xSrxTiO3 Thin Films and Ceramics, J. Appl. Phys. 109, 034108 (2011), pp. 034108-1-034108-5.

J.F. Ihlefeld, et al., Extrinsic Scaling Effects on the Dielectric Response of Ferroelectric Thin Films, J. Appl. Phys. 103, 074112 (2008), pp. 074112-1-074112-6.

R.A. Assink and R.W. Schwartz, 1H and 13C NMR Investigations of Pb (Zr,Ti)O3 Thin-Film Precursor Solutions, Chem. Mater. 1993, 5, pp. 511-517.

S. Hoffmann and R. Waser, Control of the Morphology of CSD-prepared (Ba,Sr) TiO3 Thin Films, Journal of the European Ceramic Society 19 (1999), pp. 1339-1343.

R.W. Schwartz, et al., Control of Microstructure and Orientation in Solution-Deposited BaTiO3 and SrTiO3 Thin Films, J. Am. Ceram. Soc. 82 (9) (1999), pp. 2359-2367.

* cited by examiner

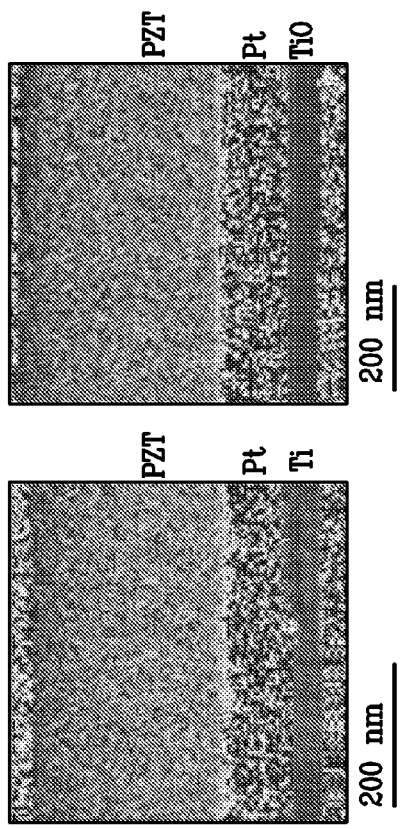
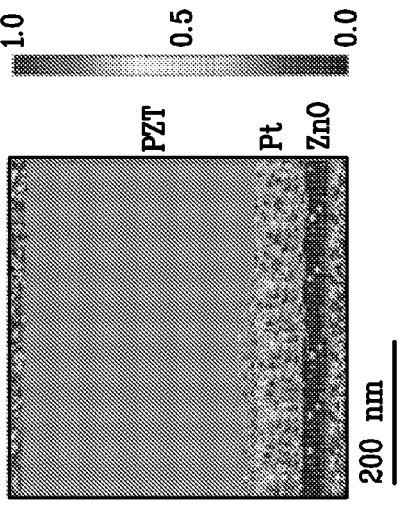
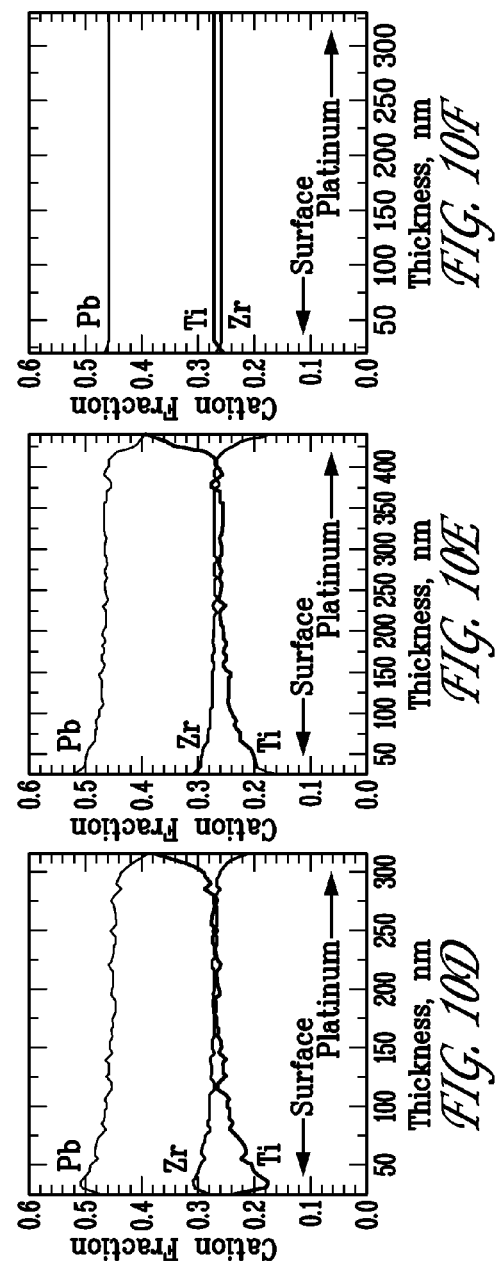
FIG. 10A  FIG. 10B  FIG. 10C
FIG. 10D  FIG. 10E  FIG. 10F

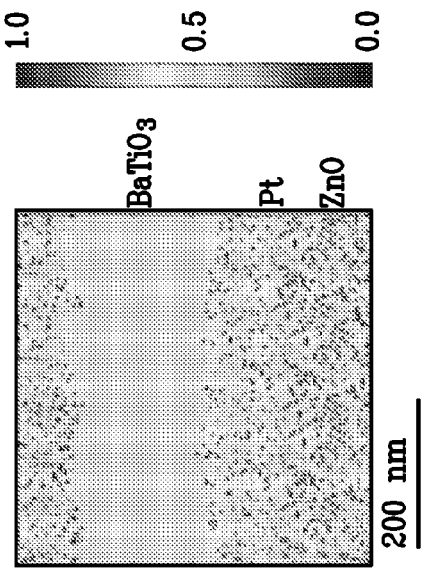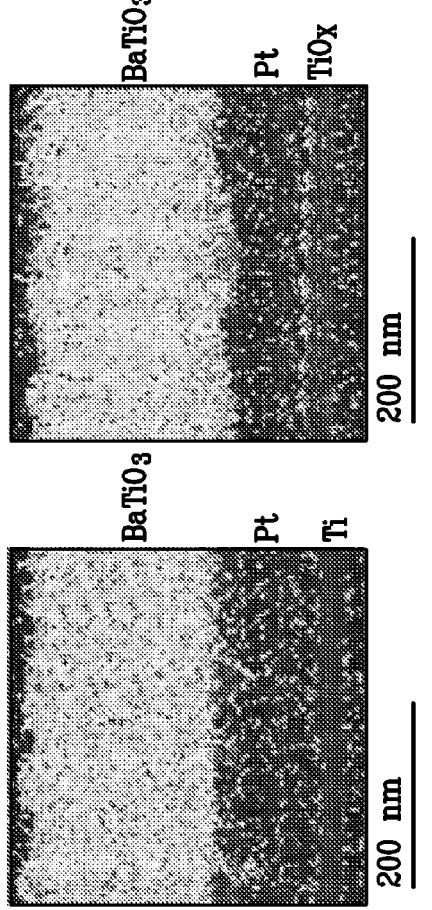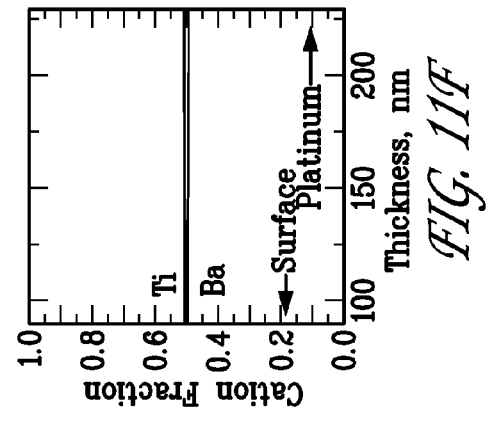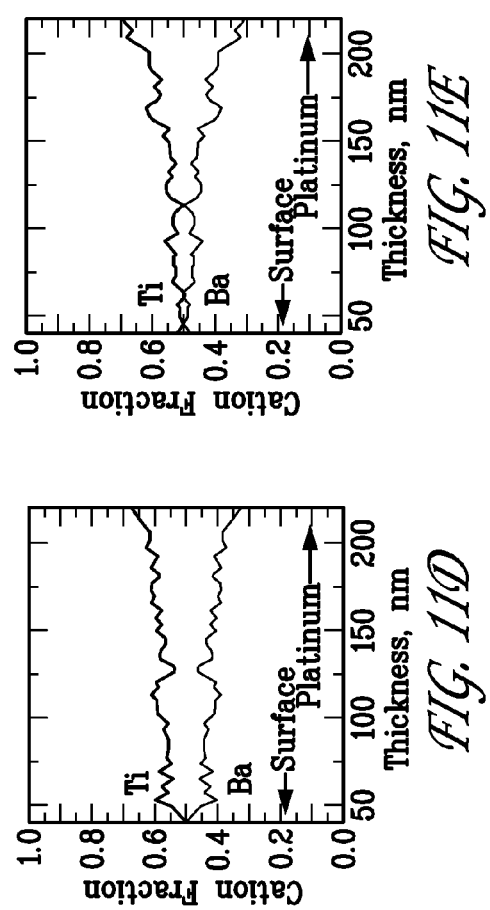
FIG. 11A  FIG. 11B  FIG. 11C
FIG. 11D  FIG. 11E  FIG. 11F

ZNO BUFFER LAYER FOR METAL FILMS ON SILICON SUBSTRATES

CROSS-REFERENCE TO RELATED APPLICATIONS

This application claims the benefit of U.S. Provisional Application No. 61/526,103, filed Aug. 22, 2011, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to ZnO-buffered metallized substrates that can provide electroceramic thin film stacks with improved remanent ferroelectric polarization and dielectric properties.

BACKGROUND OF THE INVENTION

Enabling broad impact utilizing the tremendously varied properties available in complex oxide thin films requires a means of integration on technologically relevant substrates, specifically mainstream semiconductors such as silicon. Many such devices require substrate metallization to form electrical contacts, and the most widely and technologically relevant is platinum-coated silicon. Platinized silicon offers great flexibility in being chemically inert in contact with many oxides, compatible with moderate processing temperatures in oxidizing, inert, or moderately-reducing atmosphere (thus requiring little or no process alteration for integration with any of a variety of complex oxide film systems), and is relatively inexpensive when used in thin layers. As such, while optimization of electrode (and/or substrate)-film interactions is emphasized for complex oxides deposited on base metals, oxide electrodes, and exotic substrates, the electrode/substrate interface is too often simply ignored or, at best, considered entirely inert, passive observers in the integration process in the vast majority of work on platinized silicon.

In spite of the extensive earlier efforts toward preparing high-quality, temperature-stable platinized silicon substrates for ferroelectric memory integration, several issues remain that are detrimental to the deposited oxide properties. The most pervasive of these are thermophysical instabilities at temperatures in excess of 700° C. including delamination and hillocking as well as diffusion of adhesion layers through the platinum; these defects often cause degraded performance and can result in inoperable devices. See H. N. Al-Shareef et al., *J. Mater. Res.* 12, 347 (1997). Additionally, the (presumed) 700° C. limit for thermal processing of films on platinum-coated silicon substrates has been highlighted as the primary source of the chasm between the (poor) measured properties of refractory oxides such as $BaTiO_3$ films on silicon wafers and the bulk-like behavior that has been achieved by processing these films at higher temperatures on other substrates. See S. M. Aygun et al., *J. Appl. Phys.* 109, 034108 (2011); and J. F. Ihlefeld et al., *J. Appl. Phys.* 103, 074112 (2008). Extensive research efforts by many groups have investigated the causes of and solutions to these issues. Several reports indicate that zirconium, tantalum, titanium oxide, and aluminum oxide adhesion layers are superior to the more common titanium in terms of lower diffusivity through the platinum layer, limited reaction with the underlying substrate, and a lack of polymorphic phase changes over the desired processing temperature range resulting in fewer mechanical defects (delamination, roughening, and hillocking). See H. N. Al-Shareef et al., *J. Mater. Res.* 12, 347 (1997); S. H. Kim et al., *Appl. Phys. Lett.* 76, 496 (2000); T. Maeder et al., *Jpn. J. Appl. Phys.* 1 37, 2007 (1998); G. R. Fox and K. Suu, U.S. Pat. No. 6,682,772; K. Sreenivas et al., *J. Appl. Phys.* 75, 232 (1994); and S. Halder et al., *Appl. Phys. A-Mater. Sci. Process.* 87, 705 (2007). These advances notwithstanding, titanium adhesion layers remain the most widespread.

Therefore, a need remains for an adhesion layer that can be used to metallize a silicon substrate and is compatible with high temperature processing.

SUMMARY OF THE INVENTION

The present invention is directed to a metallized substrate, comprising a silicon substrate; a ZnO buffer layer on the silicon substrate; and a metal layer on the ZnO buffer layer. The metal layer can comprise a noble metal, such as platinum, gold, or palladium, or a relatively noble metal, such as copper, silver, or nickel. An electroceramic thin film stack can further comprise a complex oxide layer, such as $BaTiO_3$, $Pb(Zr,Ti)O_3$, $SrBi_2Ta_2O_9$, $BiFeO_3$, $Bi_4Ti_3O_{12}$, or $(Bi,Na)TiO_3$, or a doped complex oxide layer, on the metallized stack. The invention is further directed to a method of preparing an electroceramic thin film stack, comprising providing an oxidized silicon substrate; depositing a ZnO buffer layer on the silicon substrate; depositing a metal layer on the ZnO buffer layer; depositing a complex oxide layer on the metal layer; and annealing the stack at a sufficiently high temperature to achieve bulk-like behavior of the complex oxide (i.e., dielectric or ferroelectric response similar to that of a bulk ceramic). The minimum annealing temperature to achieve bulk-like behavior is greater than about 600° C. for a complex oxide layer comprising $Pb(Zr, Ti)O_3$ and greater than about 800° C. for a complex oxide layer comprising $BaTiO_3$.

Dramatic improvements in metallization integrity and electroceramic thin film performance can be achieved by the use of the ZnO buffer layer to minimize interfacial energy between metallization and adhesion layers. Improved ferroelectric and dielectric response has been demonstrated in two exemplary ferroelectric thin film materials, PZT and $BaTiO_3$. This enhanced performance correlates to greatly improved chemical homogeneity, which is a direct result of deposition on ZnO-buffered substrates. The invention has broad implications for electroceramic thin film synthesis. In particular, the invention provides a substrate metallization method utilizing an adhesion layer that has a high work of adhesion, which in turn enables processing under thermal budgets typically reserved for more exotic ceramic, single-crystal, or metal foil substrates. Embodiments of the present invention can be used in a broad range of applications beyond ferroelectric capacitors, including microelectromechanical systems, micro-printed heaters and sensors, and electrochemical energy storage, where integrity of metallized silicon to high temperatures is necessary.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 5(d) shows a comparison of the films on each substrate.

FIGS. 10(a-f) are quantified composition maps of titanium ions and quantified lead, zirconium and titanium cation distributions through the thickness of $Pb(Zr,Ti)O_3$ films deposited on titanium-buffered (a & d), $TiO_x$-buffered (b & e), and ZnO-buffered (c & f) platinized silicon substrates. Note that the quantification algorithm in regions that nominally do not contain titanium (e.g. platinum electrodes) results in amplification of measurement noise and not is representative if actual titanium concentrations.

FIGS. 11(a-f) are quantified composition maps of titanium ions and quantified barium and titanium cation distributions through the thickness of $BaTiO_3$ films deposited on titanium-buffered (a & d), $TiO_x$-buffered (b & e), and ZnO-buffered (c & f) platinized silicon substrates.

DETAILED DESCRIPTION OF THE INVENTION

Figure 1:
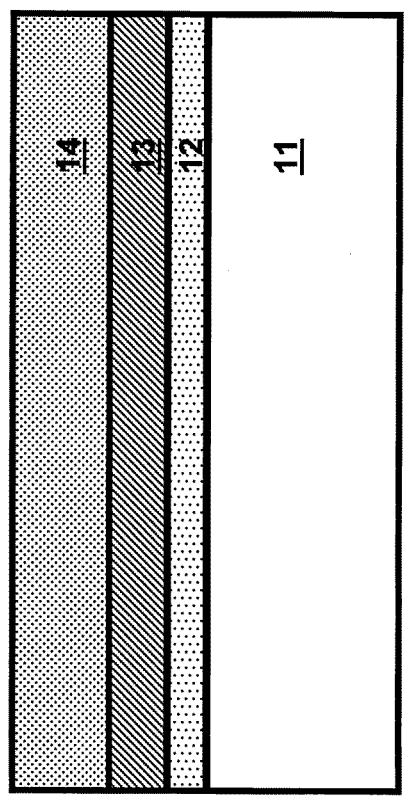
FIG. 1 is a schematic illustration of a thin-film electrode stack.

A long-standing challenge to the widespread application of complex oxide thin films is the stable and robust integration of noble metal electrodes, such as platinum, which remains the optimal choice for numerous applications. The present invention is directed to a metallized substrate comprising an improved adhesion layer, as shown in FIG. 1. The metallized substrate comprises an oxidized silicon substrate 11; a ZnO buffer layer 12 on the silicon substrate 11; and a metal layer 13 on the ZnO buffer layer 12. In general, the metal is preferably remains conductive and when processed at high temperatures. For example, the metal layer 13 can comprise a noble metal, such as platinum, gold, or palladium, or a relatively noble metal, such as copper, silver, or nickel. The metallized substrate can further comprise a complex oxide layer 14 on the metal layer 13. For example, the complex oxide layer can be $BaTiO_3$, $Pb(Zr,Ti)O_3$, $SrBi_2Ta_2O_9$, $BiFeO_3$, $Bi_4Ti_3O_{12}$, or $(Bi,Na)TiO_3$, or a doped complex oxide. For example, dopants for doped $Pb(Zr,Ti)O_3$ can include La, Dy, Nd, Ta, Sn, Sr, and Ba. For example, dopants for doped $BaTiO_3$ can include Sr, Ca, Zr, Sn, Mn, Mg, Al, and Y. By considering both work of adhesion and stability against chemical diffusion, the use of a ZnO buffer layer enables dramatic improvements in the properties of the overlying functional oxide films. Using $BaTiO_3$ and $Pb(Zr,Ti)O_3$ films as exemplary complex oxides, as described below, the use of ZnO as the adhesion layer leads directly to increased process temperature capabilities and dramatic improvements in chemical homogeneity of the oxide films. These result in significant property enhancements (e.g., 300% improvement to bulk-like permittivity for the $BaTiO_3$ films) of oxide films prepared on Pt/ZnO as compared to conventional Pt/Ti and Pt/$TiO_x$ stacks. A comparison of electrical, structural, and chemical properties demonstrate the impact of adhesion layer chemistry on the chemical homogeneity of the overlying complex oxide is described below. In addition to satisfying the simple need for adhesion, metal-oxide layers between noble metals and silicon can have tremendous chemical impact on the terminal complex oxide layers.

Considerations for proper adhesion layers include chemical compatibility with the substrate and the metal electrode, phase stability, interfacial energy, and stability against chemical diffusion. Many previously investigated materials, in their oxide form, do not form low energy interfaces with common electrode metals. Large contact angles (~120°) and concomitantly low work of adhesion values (<1 J m$^{-2}$) are observed for relatively noble metals copper, silver, and nickel on $ZrO_2$; similarly high contact angles of 124° are observed for gold on $TiO_2$; and while alumina adhesion layers have shown reasonable stability to high temperatures, metals such as gold and copper have large contact angles (~130° and ~125°, respectively) and low work of adhesion values (~0.6 J m$^{-2}$ for copper/$Al_2O_3$) and a similarly low work of adhesion for platinum 1.05 J m$^{-2}$ has been reported. See S. Halder et al., *Appl. Phys. A-Mater. Sci. Process.* 87, 705 (2007); D. Sotiropoulou and P. Nikolopoulos, *J. Mater. Sci.* 28, 356 (1993); D. Chatain et al., *J. Am. Ceram. Soc.* 76, 1568 (1993); B. J. Laughlin, PhD thesis, "Sputtered $(Ba_x, Sr_{1-x})TiO_3$, BST, Thin Films on Flexible Copper Foils for Use as a Non-Linear Dielectric," North Carolina State University, Raleigh (2006); and M. McLean and E. D. Hondros, *J. Mater. Sci.* 6, 19 (1971). Contrasting these values with those observed for copper, which is isostructural with platinum, wetting ZnO reveals a low contact angle of 62° and a high work of adhesion of 2.01 J m$^{-2}$ that is twice as large as any reported for other investigated adhesion layers. See B. J. Laughlin, PhD Thesis (2006). This high work of adhesion suggests that ZnO may be an excellent adhesion layer for metal electrodes by providing a low energy interface between the metal film and buffer oxide. While none of the traditional adhesion layer metals are thermodynamically stable in contact with platinum for conventional processing temperatures (phase diagrams reveal a number of intermetallic phases for each), the adhesion layer oxides are, in general, thermodynamically stable. Most common metallic adhesion layers (Zr and Ta) oxidize quickly during processing and remain relatively stable (albeit with poor adhesion). See T. Maeder et al., *Jpn. J. Appl. Phys.* 1 37, 2007 (1998). There is, however, a precedent for titanium to readily diffuse through the platinum electrode and form a thin layer on the platinum surface. See S. H. Kim et al., *Appl. Phys.*

Lett. 76, 496 (2000); T. Maeder et al., *Jpn. J. Appl. Phys.* 1 37, 2007 (1998); K. Sreenivas et al., *J. Appl. Phys.* 75, 232 (1994); and G. R. Fox et al., *J. Mater. Res.* 10, 1508 (1995). However, the ZnO-buffered platinum films of the present invention maintain mechanical integrity to higher temperatures than typical titanium and titanium oxide buffered substrates owing to improved wetting. Further, these substrates can be used to dramatically improve the performance of prototypical complex oxide thin films by 1) allowing access to previously difficult to realize processing temperatures and 2) minimizing chemical heterogeneities directly related to diffusion of buffer layer species through the electrode.

To test the applicability of ZnO as an adhesion layer for platinized silicon substrates, a series of platinum films on thermally oxidized silicon substrates were prepared with traditional titanium, titanium oxide, and zinc oxide buffers via radiofrequency (RF)-magnetron sputtering. The general structure was as follows: 100 nm Platinum/40 nm buffer/400 nm $SiO_2$/(001)-oriented silicon. Titanium and titanium oxide films were prepared by sputtering from a titanium target. Titanium oxide was formed by heating the titanium coated substrate in vacuo to 400° C. in 15 mTorr of oxygen for 30 minutes; as the precise phase and oxidation state is unknown, the titanium oxide buffer is denoted as $TiO_x$ herein. See H. N. Al-Shareef et al., *J. Mater. Res.* 12, 347 (1997). Zinc oxide buffer layers were deposited from a sintered ceramic target. All buffer layers were capped with platinum without breaking vacuum. In each case predominantly (111)-oriented platinum was observed via X-ray diffraction. For the ZnO buffered film, only the peak attributed to the 0002 reflection of ZnO could be observed, indicating that the ZnO was deposited with a preferential c-axis orientation.

Figure 2:
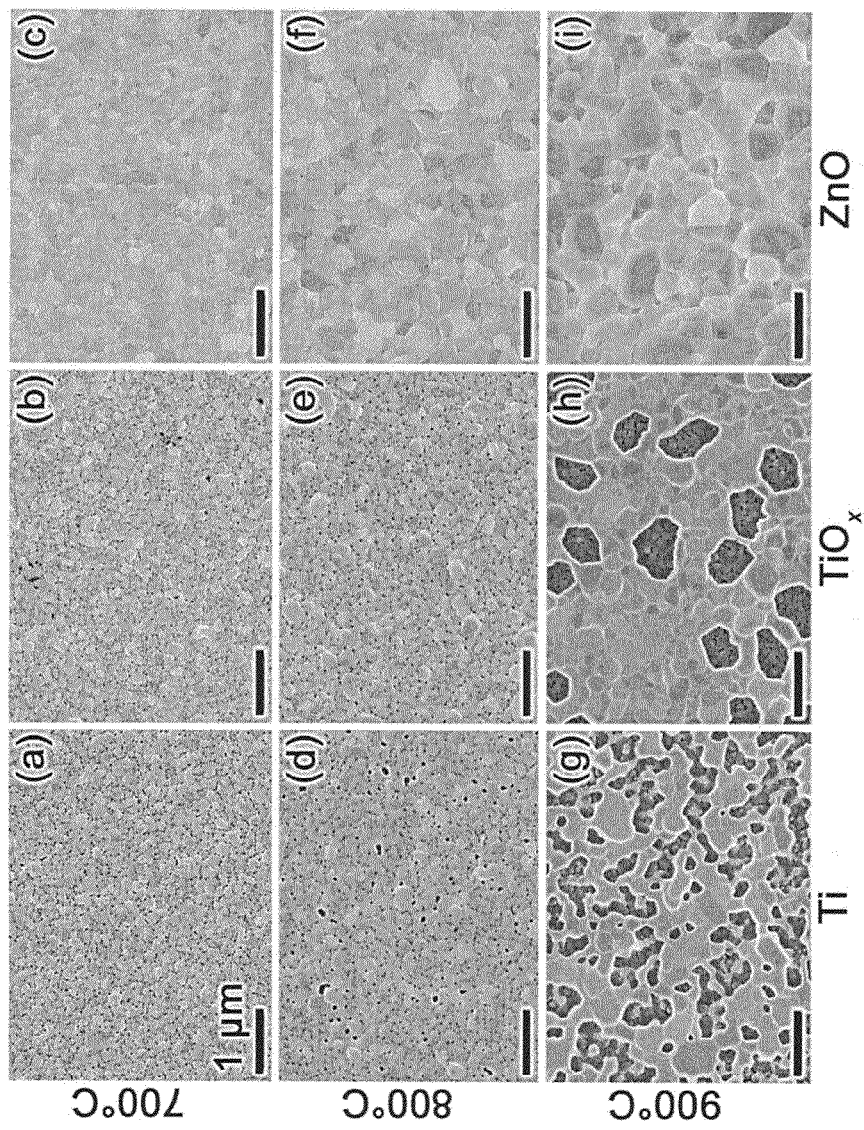
FIGS. 2(a-i) are scanning electron micrographs of platinum films deposited titanium- (a, d, g), titanium oxide- (b,e, h), and zinc oxide- (c,f,i) buffered $SiO_2$/silicon substrates and annealed for one hour in air at 700° C., 800° C., and 900° C.

To investigate the thermal stability, platinum films were processed ex situ in air by annealing at temperatures ranging from 500° C. to 900° C. for 1 hour. FIG. 2 shows representative scanning electron microscopy (SEM) images for the platinum films annealed at 700, 800, and 900° C. with the three different buffer layers. Distinct differences in the platinum microstructure with adhesion layer and annealing temperature can be observed. For films processed on titanium buffer layers, a microstructure showing voids in the platinum layer is evident at 800° C. with significant dewetting occurring by 900° C. Films on $TiO_x$ buffer layers appear to be more robust and exhibit dewetting behavior at 900° C. Small dark areas at the platinum grain boundaries are observed in the SEM images for the films on titanium and $TiO_x$ buffer layers. This is consistent with electron emission from a lower atomic number material and is indicative of the presence of titanium on the surface as has been observed by previous researchers. See G. R. Fox et al., *J. Mater. Res.* 10, 1508 (1995). For each processing condition, films on ZnO buffer layers display very few voids in the platinum layer and possess larger platinum grains. This data is consistent with platinum preferentially wetting the ZnO adhesion layer.

To assess the performance of the ZnO-buffered platinized silicon substrates for complex oxide thin film applications, traditional ferroelectric thin films, $PbZr_{0.52}Ti_{0.48}O_3$ (PZT) and $BaTiO_3$, were prepared via chemical solution deposition (CSD) on each of the titanium-, $TiO_x$-, and ZnO-buffered substrates. $PbZr_{0.52}Ti_{0.48}O_3$ solutions were prepared via an inverted-mixing order chelate chemistry described elsewhere. See R. A. Assink and R. W. Schwartz, *Chem. Mat.* 5, 511 (1993). Titanium isopropoxide and zirconium butoxide (80% in butanol) were combined and chelated with 4 molar equivalents of acetic acid. Methanol was added and the solution heated to 90° C. and 20 mole percent excess lead (IV) acetate was added and dissolved. The solution was then cooled to room temperature and diluted with sequential additions of methanol and acetic acid resulting in a 0.4 M solution. Films were deposited via spin casting at 3000 RPM for 30 seconds and then placed on a 350° C. hotplate for 1 minute and the process repeated three times. The films were then annealed at 700° C. in air for 10 minutes for crystallization. $BaTiO_3$ solutions were prepared via a chelate chemistry chemical solution technique based on previous studies. See S. Hoffmann and R. Waser, *J. Eur. Ceram. Soc.* 19, 1339 (1999); and R. W. Schwartz et al., *J. Am. Ceram. Soc.* 82, 2359 (1999). Titanium isopropoxide was chelated with 2 molar equivalents of 2,4 pentanedione at room temperature. Separately, a molar excess of barium acetate was dissolved in propionic acid at a concentration of 0.25 M. The barium precursor solution was then added to the titanium precursor in an amount necessary for a stoichiometric 1:1 barium:titanium ratio. The solution was then diluted to 0.15 M with methanol. Films were deposited via spin casting at 3000 RPM for 30 seconds and subsequently placed on a 250° C. hotplate for 5 minutes for solvent evaporation and gel consolidation. This spin and hotplate anneal process was repeated twice and then the films were fired in air to 900° C. for 30 minutes with 20° C. per minute ramp rates. Film thickness was increased by repeating this process two times for a total of 9 spin cast layers. For both PZT and $BaTiO_3$ films, platinum top electrodes 100 nm thick and ~1 $mm^2$ were deposited via RF magnetron sputtering through a shadow mask. Electrode areas were verified by optical microscopy and image analysis. PZT films were processed at 700° C., as is conventional for device quality material, and $BaTiO_3$ films were processed at 900° C., a condition that is traditionally unattainable on platinized silicon substrates and that has previously been shown to enable bulk-like dielectric responses. See G. L. Brennecka et al., *J. Am. Ceram. Soc.* 93, 3935 (2010); and J. Ihlefeld et al., *J. Electroceram.* 14, 95 (2005).

Figure 3:
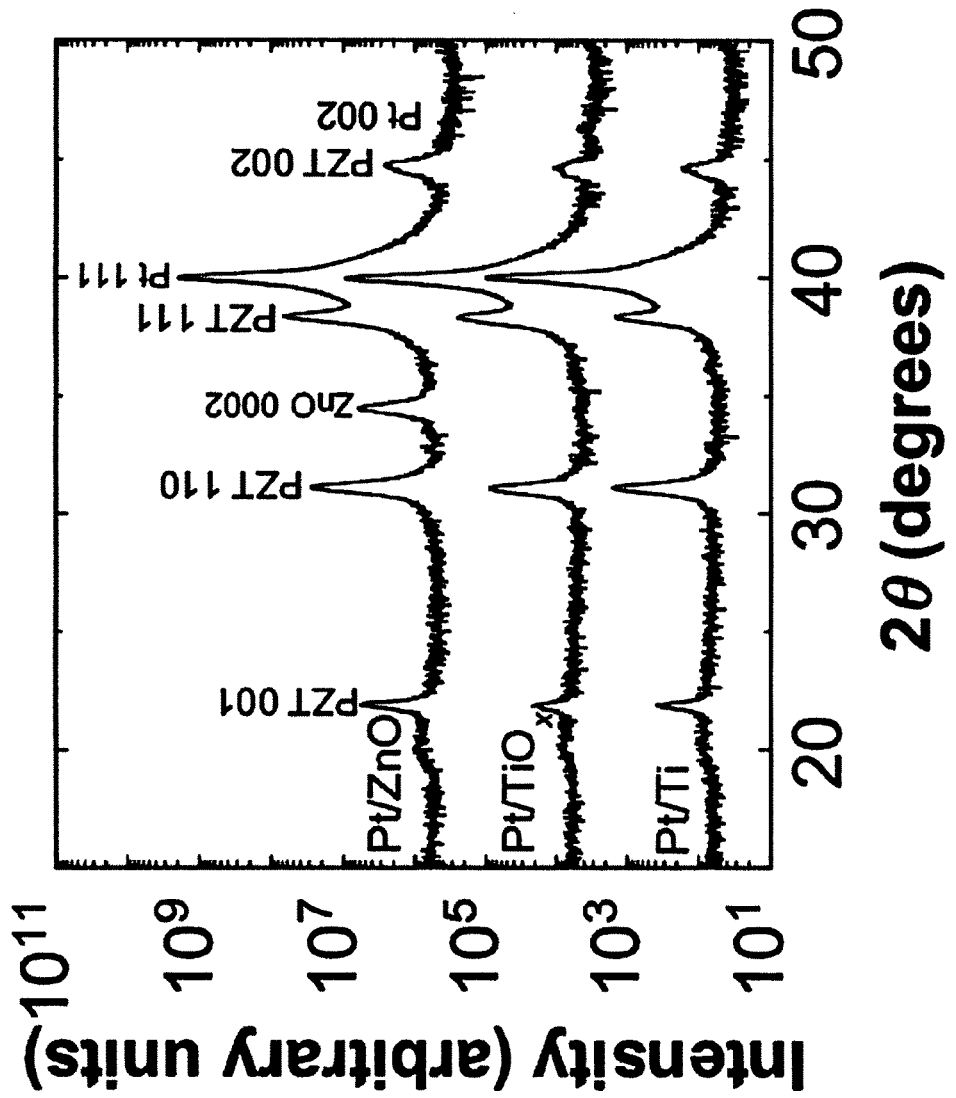
FIG. 3 is a graph of X-ray diffraction patterns of $Pb(Zr,Ti)O_3$ films deposited on titanium-, $TiO_x$-, and ZnO-buffered platinized silicon substrates and processed at 700° C.
Figure 4:
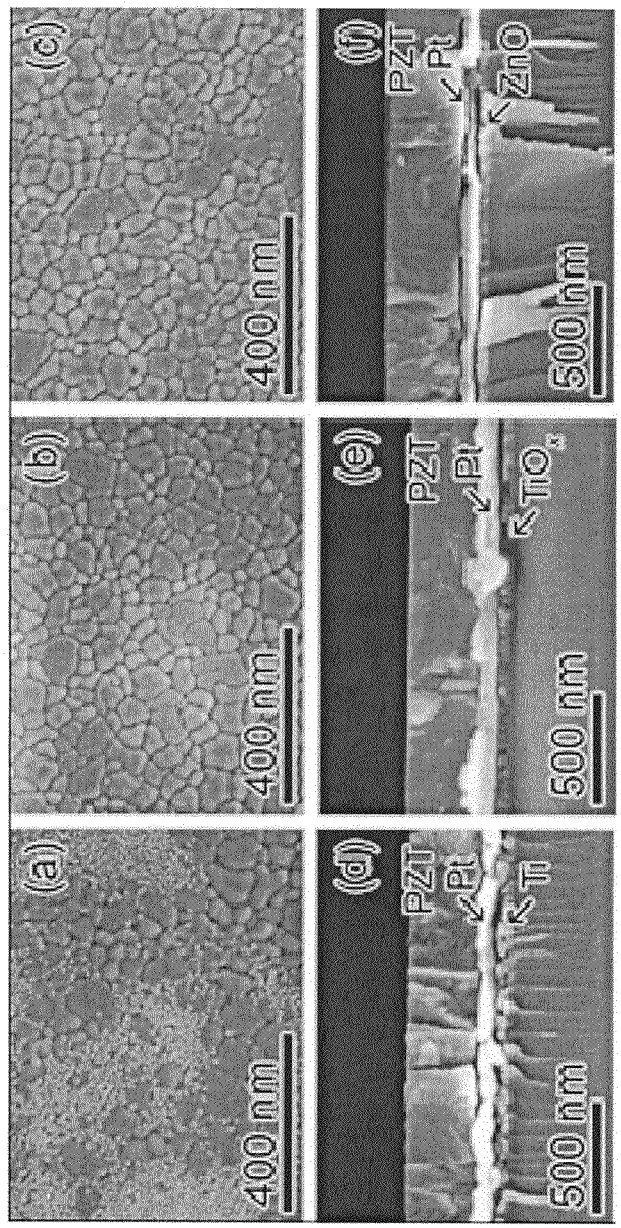
FIGS. 4(a-f) are plan-view and cross-sectional scanning electron microscopy images of $Pb(Zr,Ti)O_3$ thin films deposited on ZnO-buffered (a & d), $TiO_x$-buffered (b & e), and titanium-buffered (c & f) platinized silicon substrates.

As shown in FIG. 3, X-ray diffraction data for the PZT films reveals phase-pure material with peaks only attributable to the film and substrate layers. The films possess no preferred crystallographic orientation, as the peak intensity ratios are consistent with a powder sample. The lack of texture likely stems from the rapid heating rate used during crystallization. See K. Nittala et al., *Advances in X-ray Analysis* 54, (2011). FIG. 4 shows plan-view and cross-sectional SEM images of the PZT films on each substrate. The films are composed of a dense columnar microstructure with slight differences in the average grain lateral dimensions spanning 87±27 nm, 80±9 nm, and 109±9 nm for Ti-, $TiO_x$-, and ZnO-buffered films, respectively. Evidence of a surface fluorite secondary phase is observed on the Ti-buffered films for these processing conditions and result in increased error in grain size measurements. The cause of this is unclear, however it appears to be present as a very thin discontinuous layer on the film surface and is generally associated with lead deficiency. See B. A. Tuttle et al., *J. Mater. Res.* 7, 1876 (1992); and I. M. Reaney et al., *J. Am. Ceram. Soc.* 77, 1209 (1994). In cross-section, the differences in the substrate metallization can be appreciated. The titanium layer in the Ti-buffered film shows evidence of roughening, likely due to oxidation and grain growth, whereas the $TiO_x$- and ZnO-buffer layers remain relatively smooth. This is consistent with relatively smooth platinum films at these temperatures as investigated in the ex-situ annealing study.

Figure 5:
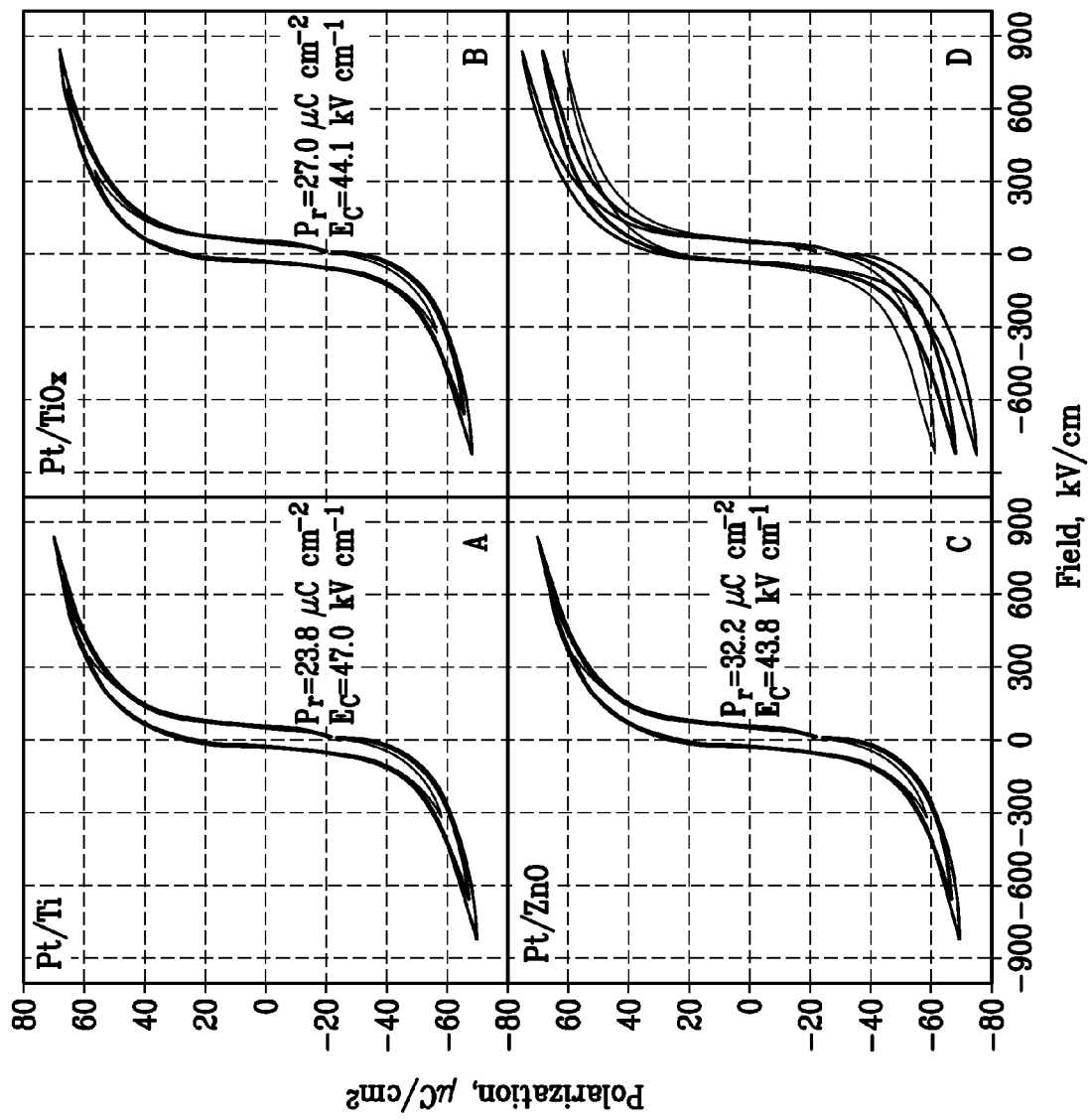
FIGS. 5(a-d) are graphs of polarization versus electric field loops collected at 10 Hz for $Pb(Zr,Ti)O_3$ films deposited on (a) titanium-buffered, (b) $TiO_x$-buffered, and (c) ZnO-buffered platinized silicon substrates.
Figure 6:
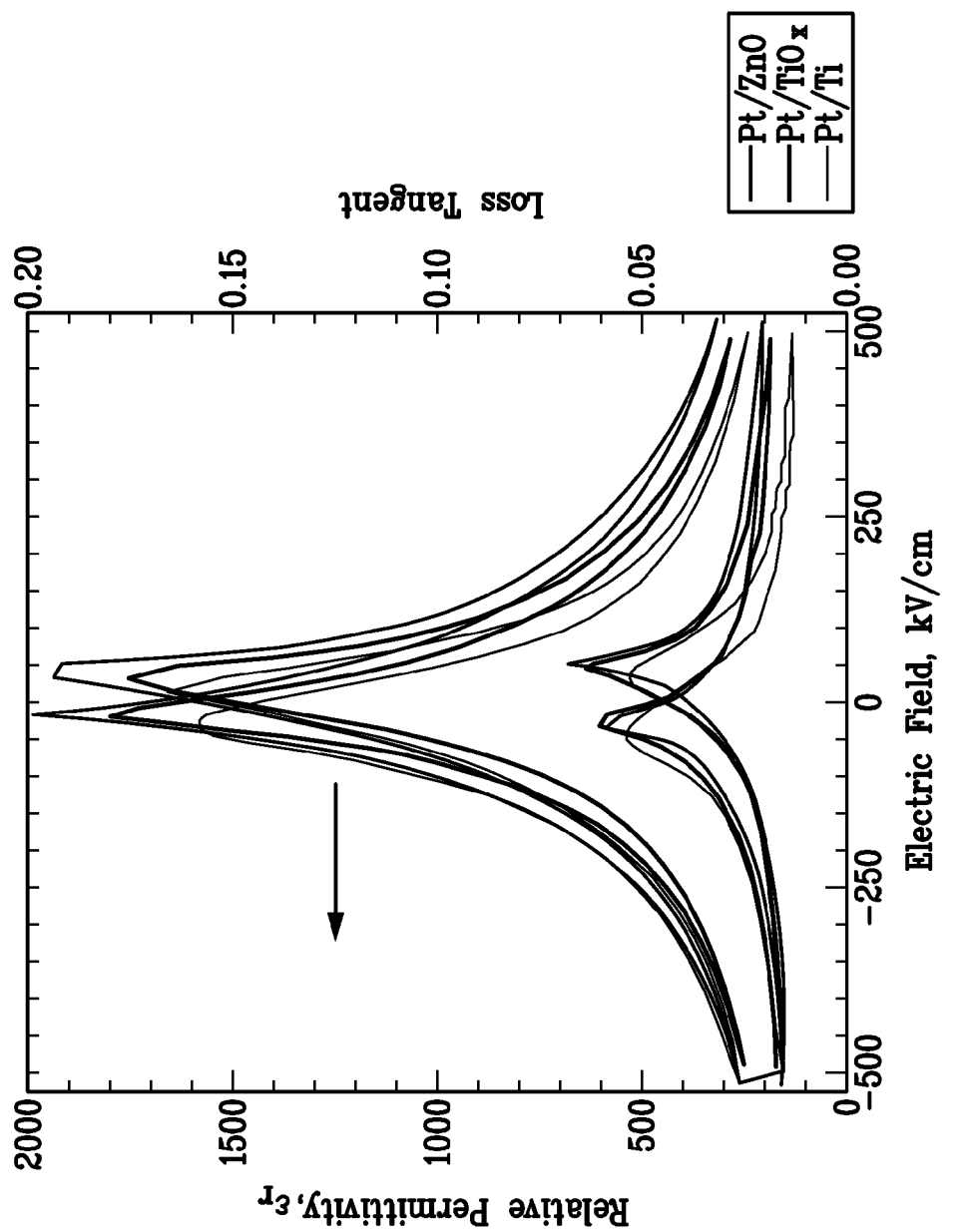
FIG. 6 is a graph of relative permittivity and dielectric loss versus electric field curves collected at 10 kHz for $Pb(Zr,Ti)O_3$ films deposited on titanium-, $TiO_x$—, and ZnO-buffered platinized silicon substrates.

Polarization-electric field measurements were performed to assess the ferroelectric properties of the PZT films on the different substrates. Nested hysteresis loops were measured at 10 Hz for each film, with the results shown in FIG. 5. In each case well saturating loops are observed, suggesting minimal contributions from electrical leakage. Remanent polarization and coercive field values for films on each substrate are noted on the figures. In comparing these values, a performance improvement on the ZnO-buffered substrates becomes evident; a remanent polarization increase of nearly 35% from 23 $\mu C\, cm^{-2}$ to 32 $\mu C\, cm^{-2}$ is observed between the traditional Ti- and the ZnO-buffered films. This increase in remanent polarization is accompanied by a decrease in coercive field from 47 $kV\, cm^{-1}$ to 43.8 $kV\, cm^{-1}$. In addition to enhanced ferroelectric response, dielectric properties also are enhanced. FIG. 6 shows permittivity versus applied electric field measurements for each film. Nearly identical high-field response is observed with permittivities saturating to approximately 260 at 500 $kV\, cm^{-1}$ and loss tangents of 0.015 (1.5%). At low fields, increases in the magnitude of the responses are observed as the zero bias and peak permittivities increase when the buffer changes from titanium to $TiO_x$ and ZnO, respectively, with the film on ZnO-buffered platinum having a zero bias value of ca. 1600 and peak value approaching 2000 at the coercive field. Enhancements in both dielectric constant and polarization coupled with the random crystallographic orientations of all films demonstrate that a simple crystallographic texturing argument cannot explain the improvements afforded through the use of the ZnO-buffered substrate.

Figure 7:
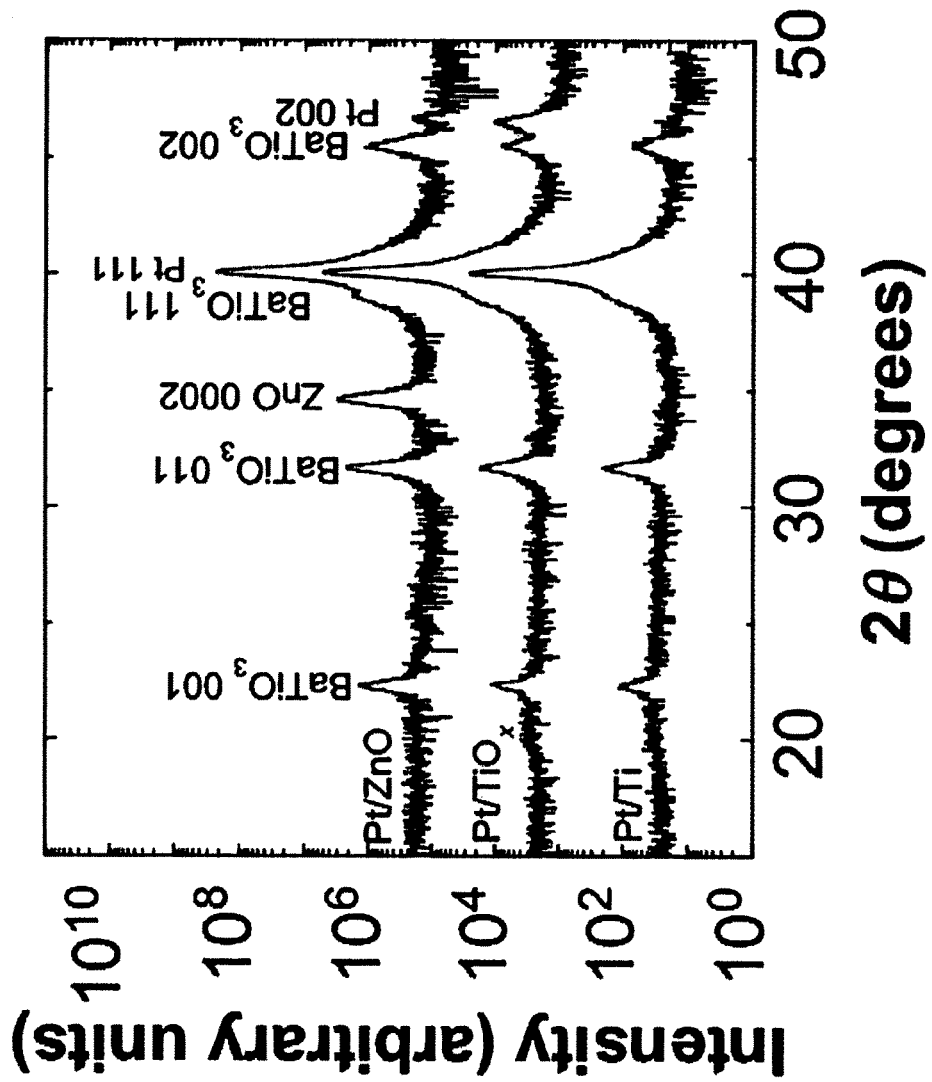
FIG. 7 is a graph of X-ray diffraction patterns of $Pb(Zr,Ti)O_3$ films deposited on titanium-, $TiO_x$-, and ZnO-buffered platinized silicon substrates and processed at 700° C.
Figure 8:
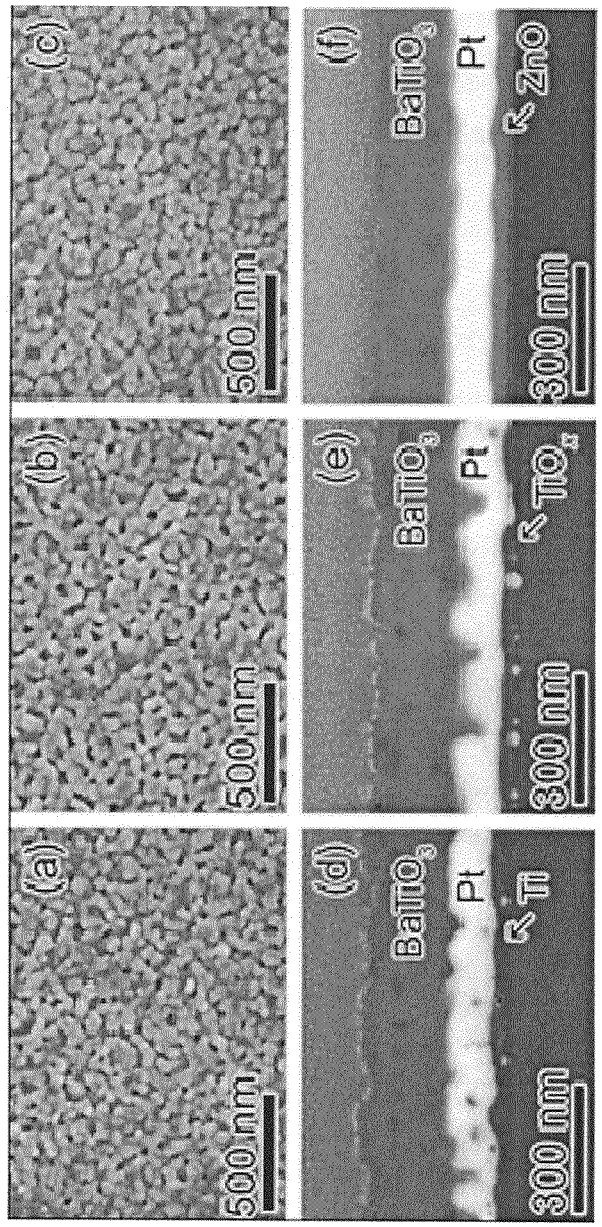
FIGS. 8(a-f) are plan-view and cross-sectional scanning electron microscopy images of $BaTiO_3$ thin films deposited on ZnO-buffered (a & d), $TiO_x$-buffered (b & e), and titanium-buffered (c & f) platinized silicon substrates. Cross-sections were prepared via focused $Ga^+$ ion beam milling.

From the substrate annealing study, mechanical integrity of the ZnO-buffered films persisted to higher temperatures, as would be expected for a metal/oxide system with a high work of adhesion. To assess the high-temperature applicability of these substrates, $BaTiO_3$ films were prepared and processed to 900° C. X-ray diffraction patterns for each film are shown in FIG. 7; in each case phase-pure randomly-oriented material is observed. Plan-view and cross-sectional SEM images for $BaTiO_3$ films on each substrate are shown in FIG. 8. Similar ceramic film microstructures are observed for each film. Average grain diameters for the $BaTiO_3$ films are 44±4 nm, 62±6 nm, and 55±11 nm for Ti-, $TiO_x$-, and ZnO-buffered films, respectively. As was observed for the PZT films, microstructural differences are identified in the electrode stacks in cross section. Both the Ti- and $TiO_x$-buffered platinum layers appear rough and possess voids. The platinum film on ZnO, however, remains relatively smooth, consistent with the platinum annealing study and a low wetting angle. The cross-sectional microstructure of the $BaTiO_3$ films reveals finite porosity levels that are uniformly distributed throughout the thickness for each film. Some thickness differences are observed with average film values of 215, 202, and 178 nm for films on Ti-, $TiO_x$-, and ZnO-buffered substrates, respectively, indicating possible improved density for films on $TiO_x$- and ZnO-buffered substrates. Some fine cracks are visible in the plan-view image and are likely due to the high coefficient of thermal expansion mismatch between $BaTiO_3$ and silicon. See T. Lipinsky et al., *J. Opt. Soc. Am. B-Opt. Phys.* 22, 913 (2005).

Figure 9:
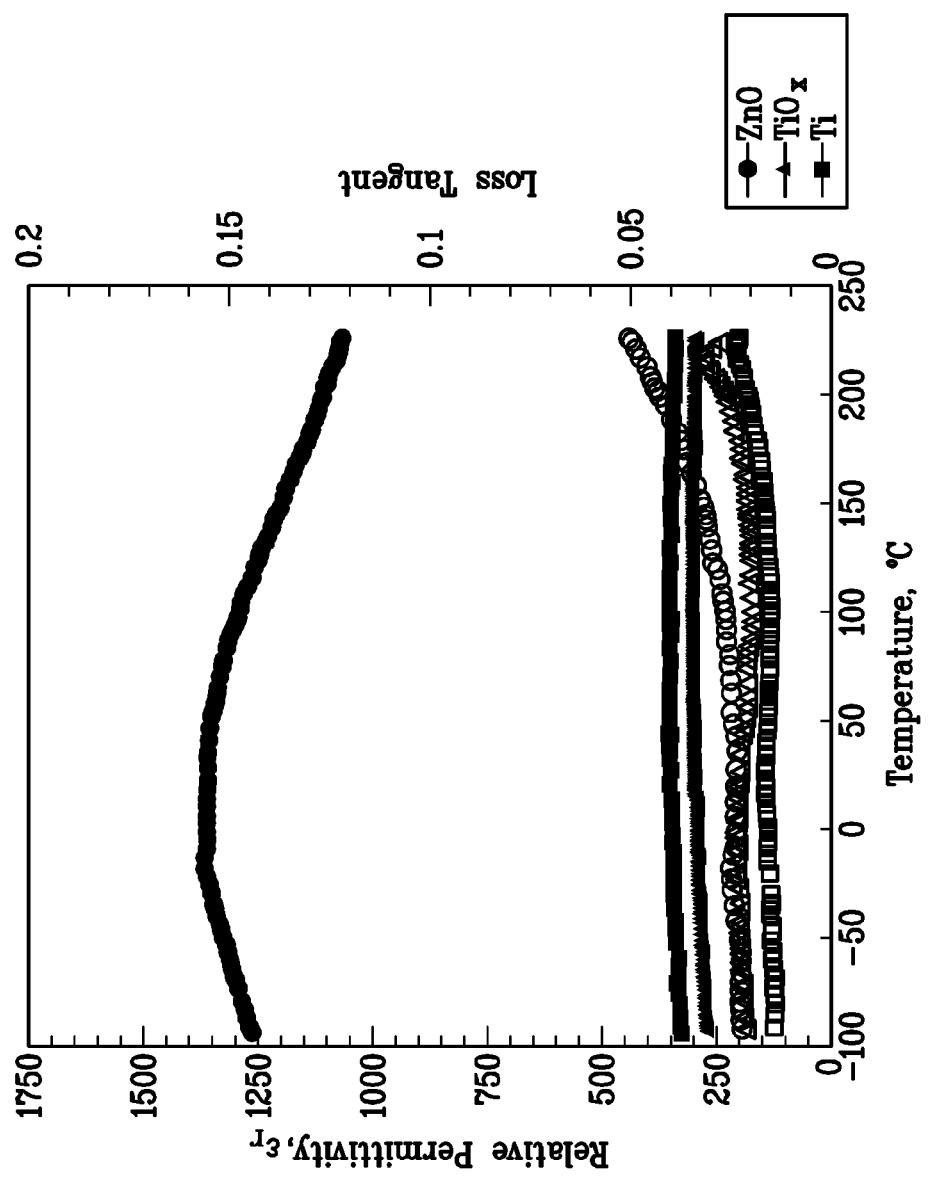
FIG. 9 is a graph of temperature dependence of permittivity and loss tangent for barium titanate thin films deposited on titanium-, $TiO_x$-, and ZnO-buffered platinized silicon substrates.

Fine cracks, such as those seen in these $BaTiO_3$ films preclude high-field measurements. However, temperature dependence of the dielectric response is a broadly accepted means to characterize $BaTiO_3$-based materials. The dielectric properties were compared for the $BaTiO_3$ films by performing temperature dependent permittivity and dielectric loss measurements between 180 and 500 K (at 1 kHz) as shown in FIG. 9. For each film the loss values remain less than 5% (tan δ<0.05) over the entire measurement range. Relatively flat permittivity responses are observed, consistent with the fine grain size, however, a striking difference in the magnitude of the relative permittivity was observed; the films deposited on the titanium- and $TiO_x$-buffered substrates had peak permittivities of less than 350 while the film deposited on the ZnO-buffered substrate possessed a peak permittivity of 1380, representing a nearly 300% increase.

Unambiguous improvements in the ferroelectric and dielectric responses have been observed for both PZT and $BaTiO_3$ films deposited on ZnO-buffered substrates. The properties measured for PZT films appear to be the best reported to date. Likewise, the permittivity approaching 1400 for the $BaTiO_3$ film of grain size 55 nm falls on the grain size-permittivity master curve that normally is reserved for well-prepared fine-grained bulk ceramics and thin films processed on base-metal or refractory substrates and represents among the highest recorded values for a $BaTiO_3$-based film deposited on a silicon substrate and possibly the highest devoid of a columnar grain morphology. See S. M. Aygun et al., *J. Appl. Phys.* 109, 034108 (2011); S. Halder et al., *Appl. Phys. A-Mater. Sci. Process.* 87, 705 (2007); S. Hoffmann and R. Waser, *J. Eur. Ceram. Soc.* 19, 1339 (1999); and J. Sigman et al., *J. Am. Ceram. Soc.* 91, 1851 (2008). This high permittivity is even more striking when considering the relatively low thickness of the film and the known thickness scaling effects in ferroelectric thin films. Given that the microstructural differences for films on each substrate are relatively minor (similar grain dimensions and porosity levels) some other attribute must be responsible. See C. B. Parker et al., *Appl. Phys. Lett.* 81, 340 (2002).

To elucidate the differences resulting in the improved ferroelectric and dielectric performance on ZnO-buffered substrates, quantitative chemical mapping using multivariate statistical analysis (MSA) with energy dispersive spectroscopy in a scanning transmission electron microscope (STEM-EDS) for the PZT and $BaTiO_3$ films was conducted, as described previously. See C. M. Parish et al., *J. Am. Ceram. Soc.* 91, 3690 (2008). FIG. 10 shows titanium composition maps and integrated distribution profiles for lead, zirconium, and titanium for the three PZT films on the different substrates. Distinct differences in the cation distributions are observed. The films processed on the titanium and $TiO_x$ buffered substrates possess enriched concentrations of titanium near the platinum/PZT interface; while the film surfaces are enriched in both zirconium and lead. This inhomogeneous cation distribution has been observed by several groups depositing PZT via chemical solution routes and has been generally ascribed to the lower nucleation barrier for $PbTiO_3$ on the platinum surface versus $PbZrO_3$. See A. Etin et al., *J. Am. Ceram. Soc.* 89, 2387 (2006); A. Dutschke et al., *J. Eur. Ceram. Soc.* 24, 1579 (2004); K. Amanuma et al., *Appl. Phys. Lett.* 65, 3140 (1994); and F. Calame and P. Muralt, *Appl. Phys. Lett.* 90, 062907 (2007). The film deposited on the ZnO-buffered platinum substrate shows virtually no composition gradient through the film thickness. In addition to the improved zirconium and titanium distributions, lead also remains evenly distributed with no surface enrichment.

Figures 12A, 12B, 12C:
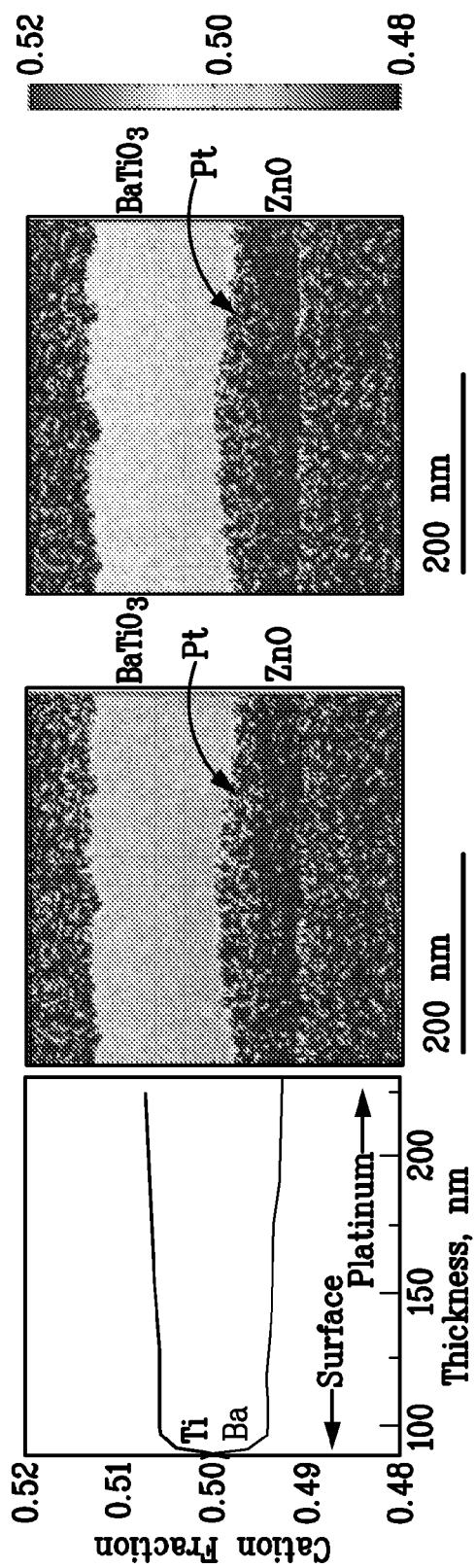
FIGS. 12(a-c) are enhanced scale STEM-EDS concentration profile (a) and (b) barium and (c) titanium concentration maps for $BaTiO_3$ films deposited on ZnO-buffered platinized silicon.

FIG. 11 shows the titanium composition maps and integrated distribution profiles for barium and titanium in the $BaTiO_3$ films. Similar to that observed in the PZT films, clear composition gradients can be seen in films processed on titanium and titanium oxide buffered substrates. Titanium enrichments of greater than 10% are observed near the platinum interface and the stoichiometry approaches unity near the film surfaces. $BaTiO_3$ films processed on ZnO-buffered substrates, however, possess minimal heterogeneities in cation distribution with both the barium and titanium concentrations remaining nearly flat throughout the thickness (a narrow compositional scale map and integrated profile for the $BaTiO_3$ film on ZnO can be found in FIG. 12). No secondary phases were observed in the X-ray diffraction patterns or in TEM even with the substantial non-stoichiometry near the platinum interface. This is consistent with the limited thermal budget used in the thin film processing, which allows for broader single-phase fields. See J. F. Ihlefeld et al., *J. Mater. Res.* 25, 1064 (2010).

The improvements in chemical homogeneity for films on ZnO-buffered substrates correspond directly with the enhancements in dielectric and ferroelectric properties. For the PZT films the highest remanent polarization and permittivity and lowest coercive fields were observed for films devoid of chemical gradients. In bulk ceramic materials peaks in remanent polarization and permittivity and a minimum in the coercive field are observed near the morphotropic phase boundary (MPB); compositions deviating by as much as 15% from the MPB, particularly toward titanium-rich compositions, possess decreased polarization and permittivity and increased coercivity. See K. Carl and K. H. Hardtl, *Ber. Dtsch. Keram. Ges.* 47, 687 (1970); and K. Carl and K. H. Hardtl, *Phys. Status Solidi A—Appl. Res.* 8, 87 (1971). The chemically homogenous film has a composition very near this boundary while chemically heterogeneous films have compositions that deviate by several percent from the composition spatially throughout the film thickness. The diminishing properties scale similarly with those expected for non-MPB compositions and this appears to be the primary cause of the observed trends. Likewise, the dramatic improvements in $BaTiO_3$ permittivity appear to be directly related to the improved chemical homogeneity. Titanium-rich $BaTiO_3$ films processed to identical temperatures tend to possess severely diminished dielectric constants. This same phenomenon appears to be responsible for the limited dielectric permittivity in the films possessing a chemical gradient and apparent titanium enrichment.

Titanium from the titanium and $TiO_X$ buffer layers likely diffuses through the platinum electrode and reacts with the PZT and $BaTiO_3$ film precursors causing chemical heterogeneities that result in diminished ferroelectric and dielectric responses. While diffusion of titanium through the platinum film when using a titanium adhesion layer may be expected based upon previous work, it is somewhat surprising that such an action would be observed from the $TiO_x$ adhesion layers. See S. H. Kim et al., *Appl. Phys. Lett.* 76, 496 (2000); K. Sreenivas et al., *J. Appl. Phys.* 75, 232 (1994); G. R. Fox et al., *J. Mater. Res.* 10, 1508 (1995); O. Auciello et al., *Annu. Rev. Mater. Sci.* 28, 375 (1998); and T. Tani et al., in *Ferroelectric Thin Films III*, Vol. 310 (Eds: E. R. Myers, B. A. Tuttle, S. B. Desu, P. K. Larsen), Materials Research Society, Pittsburgh, 269 (1992). The $TiO_x$ layer is likely oxygen deficient and titanium is diffusing through the platinum in order to reach a lower free energy oxide state. The presence of a fluorite phase on the surface of the PZT film on titanium-buffered platinum is consistent with this model. Excess titanium diffusing from the adhesion layer would consume excess lead in the film, effectively acting as a lead sink. This would result in net lead deficiency in the film, which commonly manifests as finite amount of fluorite phase on the film surface. With the substitution of ZnO for titanium in the electrode stack, not only is the integrity of the platinum electrode improved in both continuity and elimination of voids owing to improved wetting, but additionally its chemical stability eliminates an extrinsic source of cations from diffusing into the overlaying film and allows for the fabrication of high-quality, chemically homogeneous complex oxide thin films.

Previous work on solution deposited PZT has shown chemical gradients in films with multiple deposition and firing steps, resulting in a 'saw-tooth' composition profile. See F. Calame and P. Muralt, *Appl. Phys. Lett.* 90, 062907 (2007). Because these prior reports observed chemical gradients even in layers deposited directly on previously crystallized PZT layers and might therefore be expected to be free from chemical influence of the buffer layer, this result would seem at odds with the observations that appear to directly link the presence of a chemical gradient with chemical influence from the buffer layer. However, the solution chemistry described herein is different than the traditional methoxyethanol-based sol-gel chemistry used by other groups and this may have an influence on the crystallization behavior.

The present invention has been described as an improved metallized substrate comprising a ZnO buffer layer for metal films on silicon substrates. It will be understood that the above description is merely illustrative of the applications of the principles of the present invention, the scope of which is to be determined by the claims viewed in light of the specification. Other variants and modifications of the invention will be apparent to those of skill in the art.

I claim:

1. An electroceramic thin film stack, comprising:
an oxidized silicon substrate;
a ZnO buffer layer deposited on the silicon substrate;
a metal layer deposited on the ZnO buffer layer; and
a complex oxide layer or a doped complex oxide layer deposited on the metal layer.

2. The electroceramic thin film stack of claim 1, wherein the metal layer comprises a noble metal.

3. The electroceramic thin film stack of claim 2, wherein the noble metal comprises platinum, gold, or palladium.

4. The electroceramic thin film stack of claim 1, wherein the metal layer comprises copper, silver, or nickel.

5. The electroceramic thin film stack of claim 1, wherein the metal has a contact angle of less than 120° on the ZnO.

6. The electroceramic thin film stack of claim 1, wherein the metal has a work of adhesion value of greater than 1 J m$^{-2}$ on the ZnO.

7. The electroceramic thin film stack of claim 1, wherein the complex oxide layer or doped complex oxide layer comprises $BaTiO_3$, $Pb(Zr,Ti)O_3$, $SrBi_2Ta_2O_9$, $BiFeO_3$, $Bi_4Ti_3O_{12}$, or $(Bi,Na)TiO_3$.

8. The electroceramic thin film stack of claim 7, wherein the $BaTiO_3$ is annealed to a temperature greater than 800° C.

9. The electroceramic thin film stack of claim 7, wherein the $Pb(Zr,Ti)O_3$ is annealed to a temperature greater than 600° C.

10. The electroceramic thin film stack of claim 7, wherein the doped complex oxide layer comprises $BaTiO_3$ doped with one or more dopants selected from the group consisting of Sr, Ca, Zr, Sn, Mn, Mg, Al, and Y.

11. The electroceramic thin film stack of claim 7, wherein the doped complex oxide layer comprises $Pb(Zr,Ti)O_3$ doped with one or more dopants selected from the group consisting of La, Dy, Nd, Ta, Sn, Sr, and Ba.

12. The electroceramic thin film stack of claim 1, wherein the complex oxide layer or doped complex oxide layer is annealed.

13. The electroceramic thin film stack of claim 12, wherein the complex oxide layer or doped complex oxide layer that is annealed at a sufficiently high temperature to achieve bulk-like behavior of the complex oxide or doped complex oxide.

14. The electroceramic thin film stack of claim 13, wherein the bulk-like behavior comprises a remanent ferroelectric polarization of greater than 23 µC cm$^{-2}$.

15. The electroceramic thin film stack of claim 13, wherein the bulk-like behavior comprises a peak permittivity of greater than about 1600.

16. The electroceramic thin film stack of claim 12, wherein the complex oxide layer or doped complex oxide layer is annealed to a temperature of greater than 700° C.

17. A method of preparing an electroceramic thin film stack, comprising:
   providing a silicon substrate;
   depositing a ZnO buffer layer on the silicon substrate;
   depositing a metal layer on the ZnO buffer layer;
   depositing a complex oxide layer on the metal layer; and
   annealing the stack at a sufficiently high temperature to achieve bulk-like behavior of the complex oxide.

18. The method of claim 17, wherein the complex oxide layer comprises $Pb(Zr,Ti)O_3$ and the annealing temperature is greater than 600° C.

19. The method of claim 18, wherein the bulk-like behavior comprises a remanent ferroelectric polarization of greater than 23 $\mu C\ cm^2$.

20. The method of claim 18, wherein the bulk-like behavior comprises a peak permittivity of greater than about 1600.

21. The method of claim 17, wherein the complex oxide layer comprises $BaTiO_3$ and the annealing temperature is greater than 800° C.

22. The method of claim 21, wherein the bulk-like behavior comprises a peak permittivity of greater than about 1380.

* * * * *